United States Patent
Yamada

[11] Patent Number: 5,889,706
[45] Date of Patent: Mar. 30, 1999

[54] APPARATUS FOR AND METHOD OF TERMINAL SETTING OF INTEGRATED CIRCUIT

[75] Inventor: Migaki Yamada, Tokyo, Japan

[73] Assignee: NEC Corporation, Tokyo, Japan

[21] Appl. No.: 865,994

[22] Filed: May 30, 1997

[30] Foreign Application Priority Data

May 31, 1996 [JP] Japan ................................. 8-138631

[51] Int. Cl.⁶ ................................................. G11C 7/00
[52] U.S. Cl. ................................. 365/189.01; 365/94
[58] Field of Search ........................ 365/94, 96, 189.01

[56] References Cited

U.S. PATENT DOCUMENTS

| 4,402,065 | 8/1983 | Taylor | 365/94 |
| 4,758,985 | 7/1988 | Carter | 365/94 |
| 5,396,639 | 3/1995 | Suenaga et al. | 365/94 |
| 5,414,825 | 5/1995 | Sakakibara et al. | 365/230.01 |

*Primary Examiner*—David Nelms
*Assistant Examiner*—M. Tran
*Attorney, Agent, or Firm*—Whitham, Curtis & Whitham

[57] ABSTRACT

In order to provide an apparatus for terminal setting of an IC having a PROM which is rewritable without affecting peripheral circuits assembled on a set board together with the IC with no special power supply prepared for the IC, the apparatus of the invention comprises means for setting each of I/O terminals (13e) of the IC not used for data-writing into the PROM, to a status predetermined respectively for said each of I/O terminals according to circuit configuration of the peripheral circuits, when data-writing into the PROM.

9 Claims, 8 Drawing Sheets

APPARATUS FOR AND METHOD OF TERMINAL SETTING OF INTEGRATED CIRCUIT

BACKGROUND OF THE INVENTION

The present invention relates to an IC (Integrated Circuit) having a PROM (Programable Read Only Memory) wherein the PROM can be programmed after the IC is assembled with peripheral circuits on a set board, without affecting the peripheral circuits.

Many set boards are provided with an IC having a PROM, wherein necessary data are recorded for customizing, function of each set board according to each user's needs.

FIG. 6 is a block diagram illustrating an example of a conventional set board having a data terminal 17, a clock terminal 18 and a mode setting terminal 19.

Referring to FIG. 6, the conventional set board comprises;

a first peripheral circuit 12 having a serial interface for data-exchanging with outside of the set board through the data terminal 17 according to a clock signal supplied through the clock terminal 18, a second peripheral circuit 16 connected to the first peripheral circuit 12, an IC 73 for exchanging data with the second peripheral circuit 16 through I/O (Input/Output) terminals 73e, referring to data prepared in a PRPM provided therein, a first power supply 74 for driving the first and the second peripheral circuits 12 and 16, and a second power supply 75 for driving the IC 73.

The IC 73 is also connected to the data terminal 17, the clock terminal 18 and the mode setting terminal 19.

When a write mode signal is supplied to the set board through the mode setting terminal 19, the IC 73 is set in a writing mode and controlled to rewrite the PROM according to data supplied through the data terminal 17 and the clock signal supplied through the clock terminal 18.

In FIG. 6, the set board is connected to a PROM writer 11 for writing data in the PROM.

FIG. 7 is a block diagram illustrating a configuration of the IC 73 of FIG. 6, comprising;

the PROM 24, a mode detector 21 for generating a write ready signal and a terminal set signal by detecting the write mode signal supplied through the mode setting terminal 19, a PROM control circuit 82 for controlling data-write and dataerase of the PROM 24 according to the write ready signal delivered from the mode detector 21, a serial interface circuit 23 for preparing data to be written in the PROM 24, when controlled with the write ready signal, from data input through the data terminal 17 making use of the clock signal supplied through the clock terminal 18, a data processing circuit 26 for processing data exchanged with the second peripheral circuit 16 referring to data stored in the PROM 24 when the IC 73 is not controlled in the writing mode, and terminal setting circuits 85 for setting terminal status of the I/O terminals 73e controlled by the terminal set signal when the IC 73 is controlled in the writing mode.

When the write ready signal is delivered, the serial interface circuit 23 stands by for receiving data from outside and the PROM control circuit 82 begins to erase data stored in the PROM 24. After data in all address of the PROM 24 are erased, the PROM control circuit 82 begins data-write processes of the PROM 24 with data supplied through the serial interface circuit 23.

In the ordinary operation mode of the IC 73, each status of the I/O terminals 73e varies according to data to be exchanged with the second peripheral circuit 16, and the second peripheral circuit 16 operates according to statuses of the I/O terminals 73e. However, when the IC 73 is controlled in the writing mode, statuses of the I/O terminals 73e vary independent of circuit configuration of the second peripheral circuit 16 and it may be made to operate abnormally, if the I/O terminals 73e are connected directly to the data processing circuit 26 connected to the PROM 24.

For this purpose, the terminal setting circuits 85 are provided, and when the IC 73 is controlled in the writing mode, every status of the I/O terminals 73e is set to an output status, so that the data processing circuit 26 is not affected, and each output logic is forced to remain at logic LOW, for example, independent of operation of the data processing circuit 26.

FIG. 8 is a circuit diagram illustrating an example of the terminal setting circuits 85, having an nMOS transistor 85-1 with its drain connected to corresponding one of the I/O terminals 73e and its source grounded. Gate of the nMOS transistor 85-1 is controlled by the terminal set signal. So, when the terminal set signal is turned to logic HIGH by the mode detector 21 detecting the write mode signal supplied through the mode setting terminal 19, logic of the I/O terminal 73e is fixed to LOW. In the ordinary operation mode, the terminal set signal is left at logic LOW, making the I/O terminal 73e to accord to logic of data to be exchanged.

However, in the IC 73 of the conventional set board of FIG. 6, statuses of the I/O terminals 73e in the writing mode can not be but fixed a priori independent of circuit configuration of the peripheral circuit 16 to be assembled together with the IC 73. So, statuses of the I/O terminals 73e in the writing mode may still cause some effect to the peripheral circuit 16.

Therefore, the first power supply 74 and the second power supply 75 are prepared separately in the conventional set board of FIG. 6, and the first power supply 74 for driving the first and the second peripheral circuits 12 and 16 is controlled to make them inactive when rewriting the PROM 24 in the IC 73.

Preparing two different power supplies needs complicated wiring and a futile space in the set board as well as a troublesome power supply setting accompanying data writing in the PROM.

SUMMARY OF THE INVENTION

Therefore, a primary object of the present invention is to provide an apparatus for and a method of terminal setting of an IC having a PROM to be assembled in a set board, wherein data write in the PROM can be performed without affecting its peripheral circuits assembled together with the IC with no special power supply prepared for the IC.

In order to achieve the object, an apparatus for terminal setting of the invention applied for an integrated circuit having a PROM comprises;

a mode detector for detecting a write mode signal supplied for controlling the integrated circuit in a writing mode for data-writing into the PROM, a terminal mode memory for storing data indicating predetermined statuses, each of I/O terminals of the integrated circuit not used in the writing mode being to be set according to each of the predetermined statuses, respectively;

a terminal mode reader for reading out the data stored in the terminal mode memory and generating terminal mode signals in the write mode, logic of each of the terminal mode signals corresponding to each of the predetermined statuses; and terminal setting circuits, each of the terminal setting circuits controlling each of statuses of the I/O terminals according to logic of corresponding each of the terminal mode signals in the writing mode.

And, a method of terminal setting of the invention applied for an integrated circuit having a PROM comprises steps of:

detecting a write mode signal supplied for controlling the integrated circuit in a writing mode for data-writing into the PROM;

reading out data stored in a terminal mode memory, the data indicating predetermined statuses, each of I/O terminals of the integrated circuit not used in the writing mode being to be set to each of the predetermined statuses, respectively; and controlling each of statuses of the I/O terminals according to a corresponding one of each of the predetermined statuses in the writing mode.

Therefore, each status of the I/O terminals of the integrated circuit can be set appropriately according to circuit configuration of the peripheral circuit, causing no inconvenient operation of the peripheral circuit even left active in the writing mode. So, there is no need for preparing a separate power supply, enabling to economize spacing of the set board.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

Now, embodiments of the present invention will be described in connection with the drawings.

Figure 1:
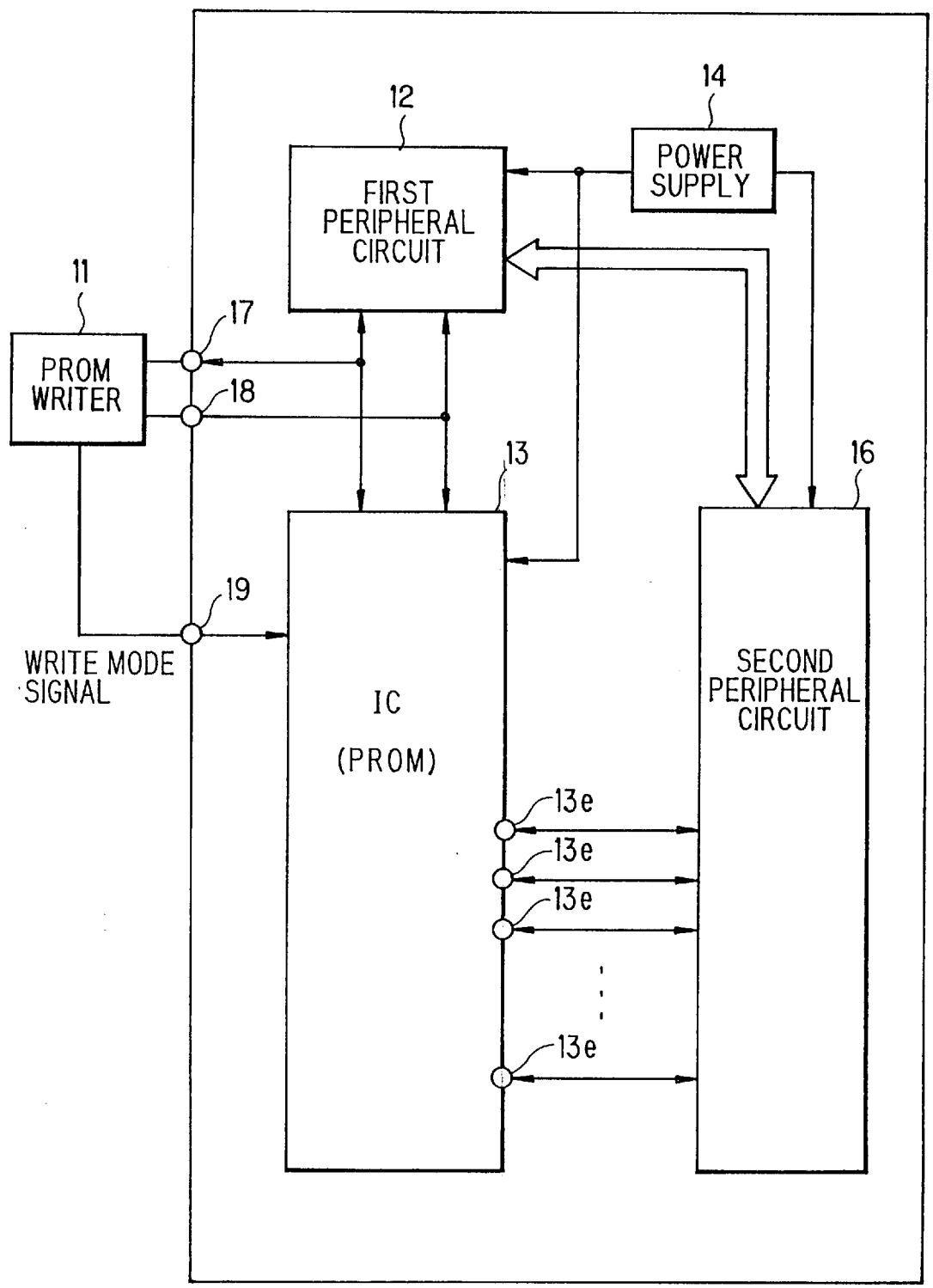
FIG. 1 is a block diagram illustrating an example of a set board wherein an IC 13 according to an embodiment of the invention is applied.

FIG. 1 is a block diagram illustrating an example of a set board having a data terminal 17, a clock terminal 18 and a mode setting terminal 19, wherein an IC 13 according to an embodiment of the invention is applied.

Referring to FIG. 1, the set board comprises;

a first peripheral circuit 12 having a serial interface for data-exchanging with outside of the set board through the data terminal 17 according to a clock signal supplied through the clock terminal 18, a second peripheral circuit 16 connected to the first peripheral circuit 12, an IC 13 for exchanging data with the second peripheral circuit 16 through I/O terminals 13e, referring to data prepared in a PRPM provided therein, and a power supply 14 for driving the first and the second peripheral circuits 12 and 16, and the IC 13.

The IC 13 is also connected to the data terminal 17, the clock terminal 18 and the mode setting terminal 19.

When a write mode signal is supplied to the set board through the mode setting terminal 19, the IC 13 is set in a writing mode and controlled to rewrite the PROM according to data supplied through the data terminal 17 and the clock signal supplied through the clock terminal 18.

In FIG. 1, the set board is connected to a PROM writer 11 for writing data in the PROM.

Figure 2:
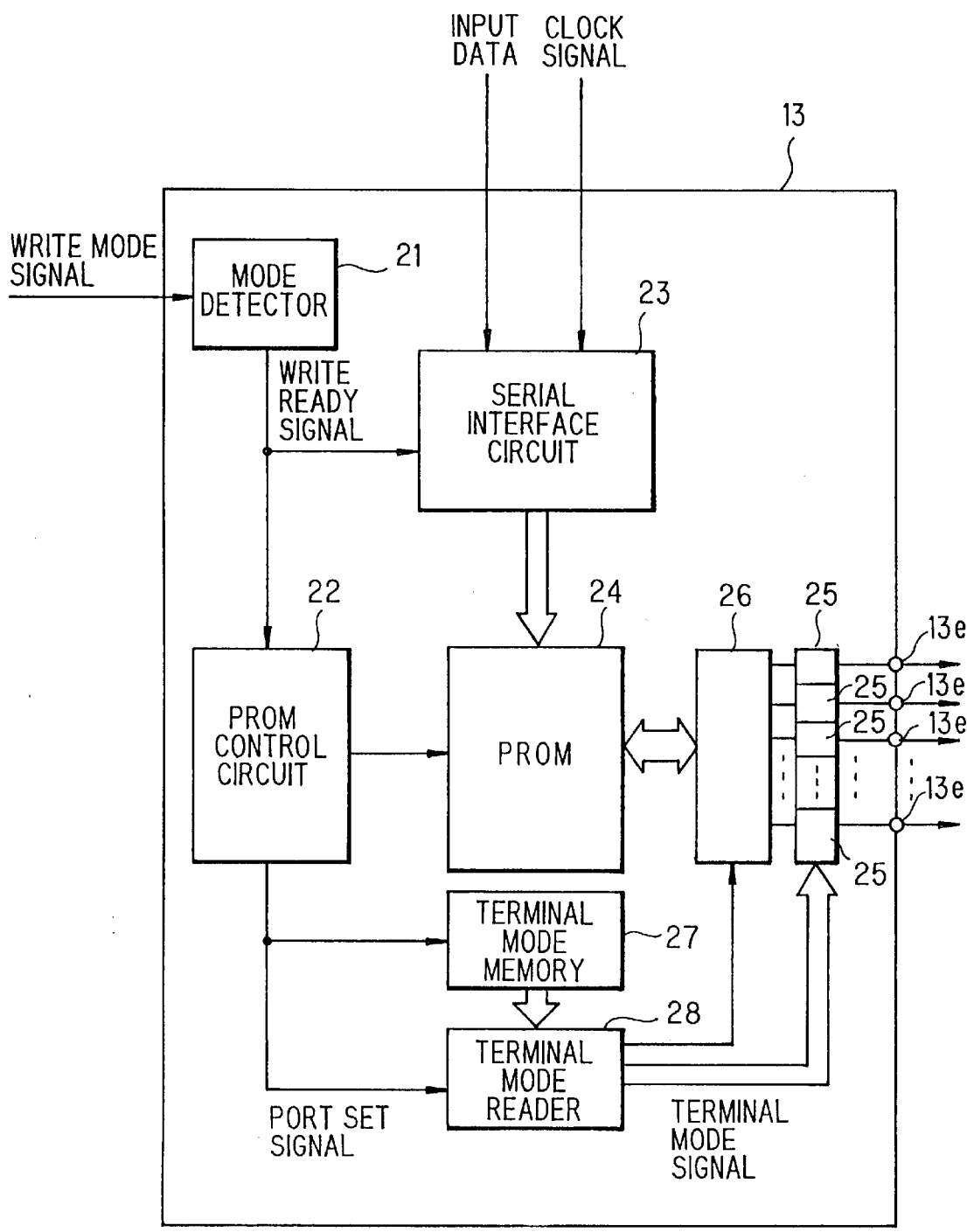
FIG. 2 is a block diagram illustrating a configuration of the IC 13 of FIG. 1.

FIG. 2 is a block diagram illustrating a configuration of the IC 13 of FIG. 1, comprising;

the PROM 24, a terminal mode memory 27 consisting of another PROM, a mode detector 21 for generating a write ready signal by detecting the write mode signal supplied through the mode setting terminal 19, a PROM control circuit 22 for controlling data-write and data-erase of the PROM 24 and generating a port set signal for controlling data read-out from the terminal mode memory 27, according to the write ready signal delivered from the mode detector 21, a serial interface circuit 23 for preparing data to be written in the PROM 24, when controlled with the write ready signal, from data input through the data terminal 17 making use of the clock signal supplied through the clock terminal 18, a data processing circuit 26 for processing data exchanged with the second peripheral circuit 16 referring to data stored in the PROM 24 when the IC 13 is not controlled in the writing mode, a terminal mode reader 28 for reading out data prepared in the terminal mode memory 27 and generating terminal mode signals according to data read out from the terminal mode memory 27, and terminal setting circuits 25 for setting terminal status of each of the I/O terminals 13e controlled by each of the terminal mode signals transferred from the terminal mode reader 28 when the IC 13 is controlled in the writing mode.

In the terminal mode memory 27, there are prepared data for indicating terminal status of each of the I/O terminals 13e appropriate for circuit configuration of the second peripheral circuit 16 to be assembled together with the IC 13 in the set board. When the terminal mode memory 27 and the terminal mode reader 28 are controlled in the write mode by the PROM control circuit 22 with the port set signal, the terminal mode reader 28 reads out data prepared in the terminal mode memory 27 and sets each logic of the terminal mode signal to be supplied to each of the terminal setting circuits 25 according to the data prepared appropriately for circuit configuration of the second peripheral circuit 16.

Figure 3:
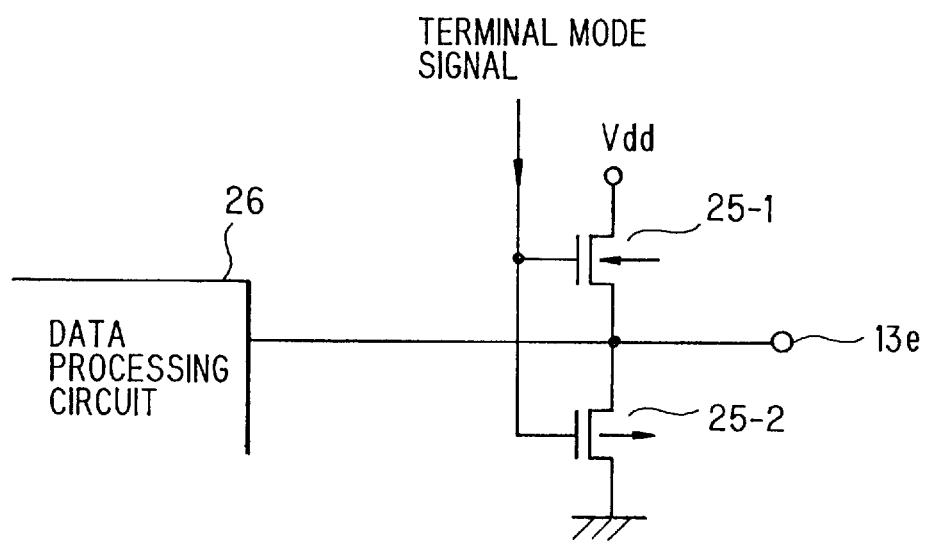
FIG. 3 is a circuit diagram illustrating an example of the terminal setting circuits 25 of FIG. 2.

FIG. 3 is a circuit diagram illustrating an example of the terminal setting circuits 25.

Referring to FIG. 3, the example of the terminal setting circuits 25 comprises an nMOS transistor 25-1 and a pMOS transistor 25-2. Sources of the nMOS transistor 25-1 and the pMOS transistor 25-2 are connected to a corresponding I/O terminal 13e and drain of the nMOS transistor 25-1 is connected to a positive supply Vdd while drain of the pMOS transistor 25-2 grounded. To the gates coupled together of the nMOS transistor 25-1 and the PMOS transistor 25-2, one of the terminal mode signals transferred from the terminal mode reader 28 corresponding to the I/O terminal 13e is supplied. Therefore, logic of the I/O terminal 13e is controlled to be the same with logic of the corresponding terminal mode signal in the writing mode. When the IC is controlled in the ordinary operation mode, the terminal mode signal is left open and the logic of the I/O terminal 13e varies according to data to be exchanged.

Thus, in the embodiment, each status of the I/O terminals 13e of the IC 13 can be set appropriately according to circuit configuration of the peripheral circuit 16, causing no inconvenient operation of the peripheral circuit 16 even left active connected with the power supply 14 in the writing mode. So, there is no need for preparing a separate power supply, enabling to economize spacing of the set board.

Heretofore, the invention is described in connection with the set board of FIG. 1 provided with a serial interface of the data terminal 17 and the clock terminal 18, but various applications can be considered in the scope of the invention.

Figure 4:
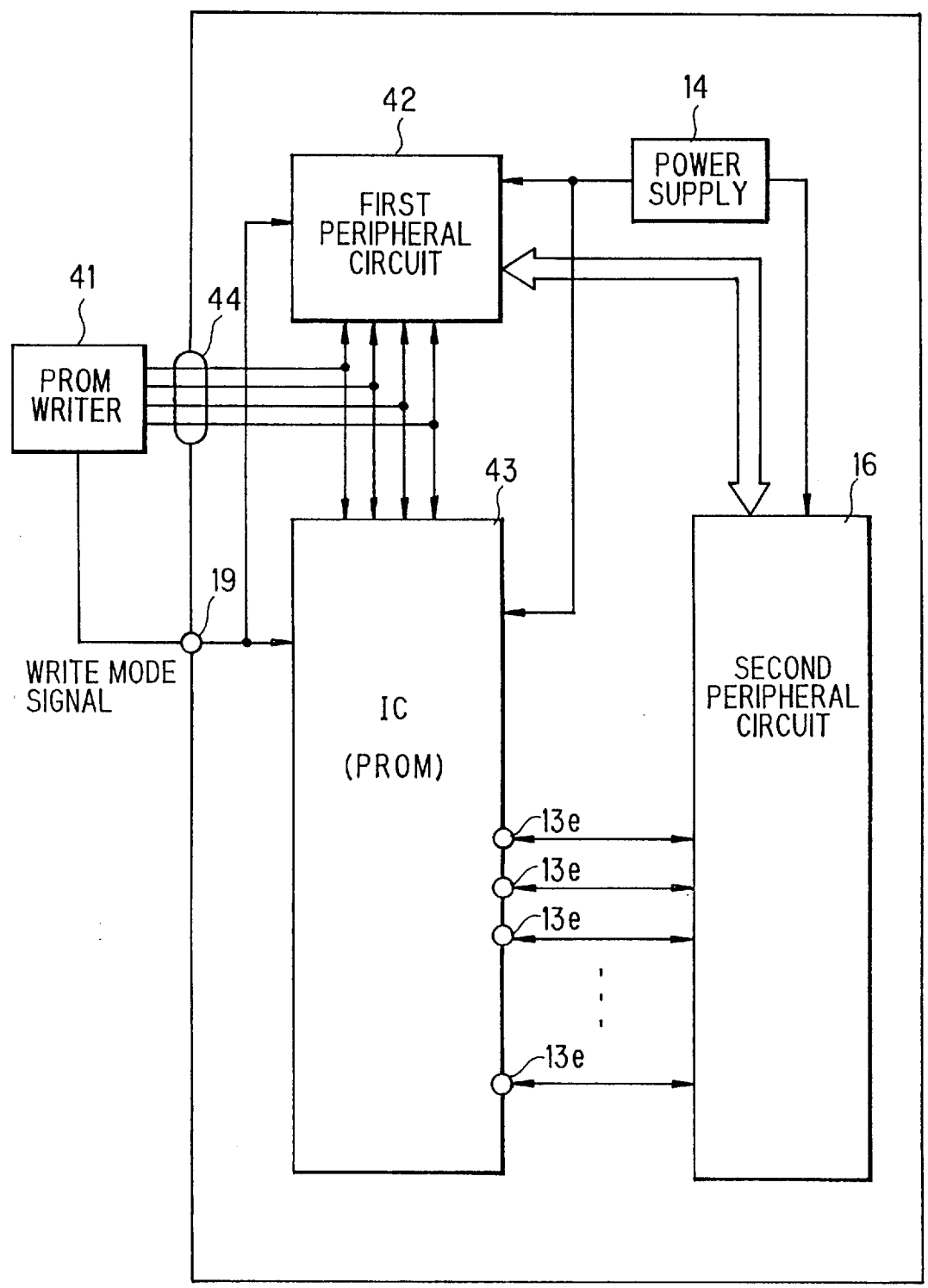
FIG. 4 is a block diagram illustrating an example of a set board wherein an IC 43 according to another embodiment of the invention is applied.

FIG. 4 is a block diagram illustrating an example of a set board, having a parallel I/O port 44 to be connected to data bus lines and a first peripheral circuit 42 including a parallel interface, wherein an IC 43 according to another embodiment of the invention is applied.

In the set board of FIG. 4 having a similar configuration to the set board of FIG. 1, the parallel interface of the first peripheral circuit 42 is also connected to the mode setting terminal 19 and controlled to cut the first peripheral circuit 42 from the parallel port 44 when the set board is connected to a PROM writer 41 and the write mode signal is supplied to the mode setting terminal 19.

Figure 5:
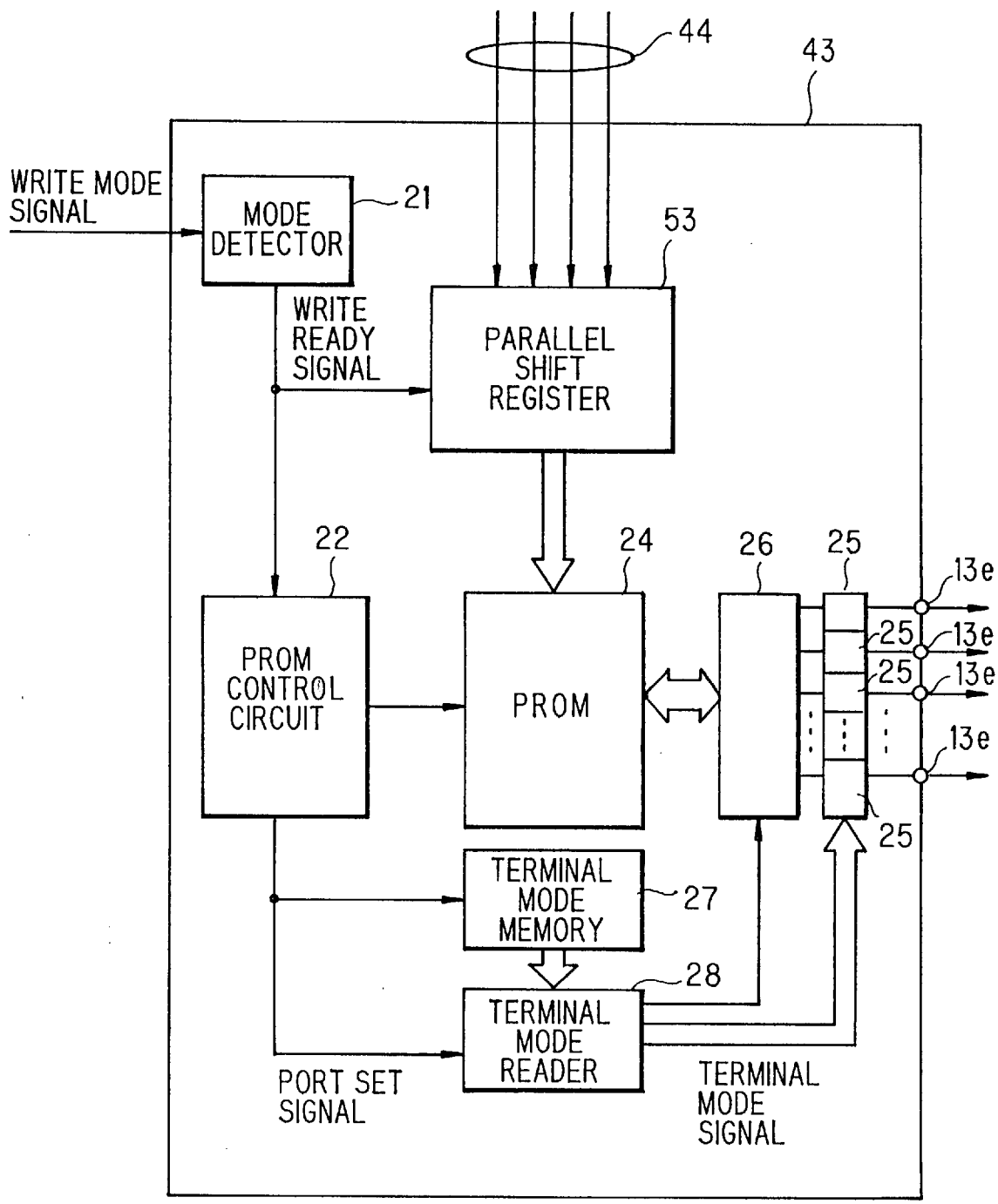
FIG. 5 is a block diagram illustrating a configuration of the IC 43 of FIG. 4.
Figure 6:
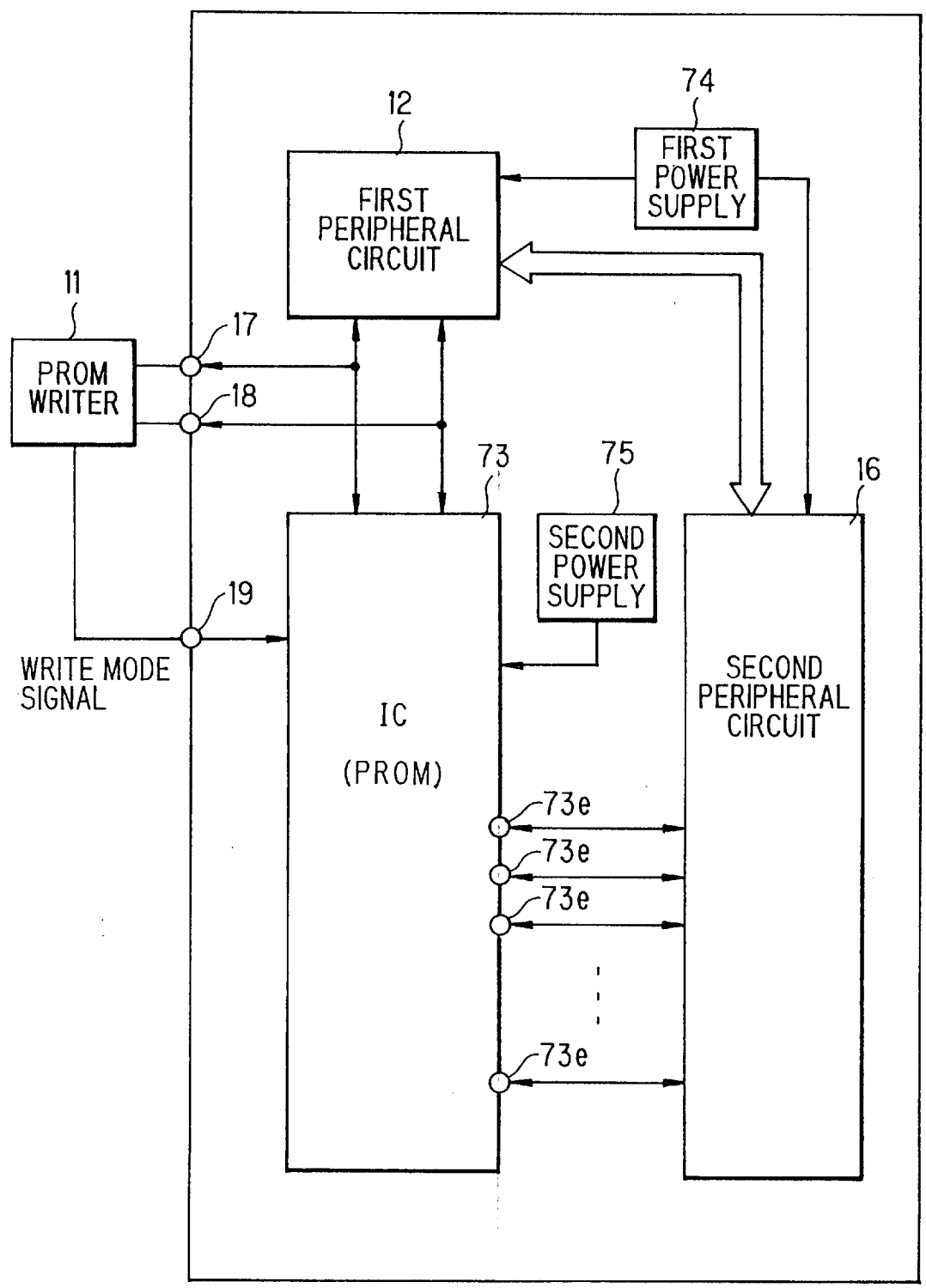
FIG. 6 is a block diagram illustrating an example of a conventional set board.
Figure 7:
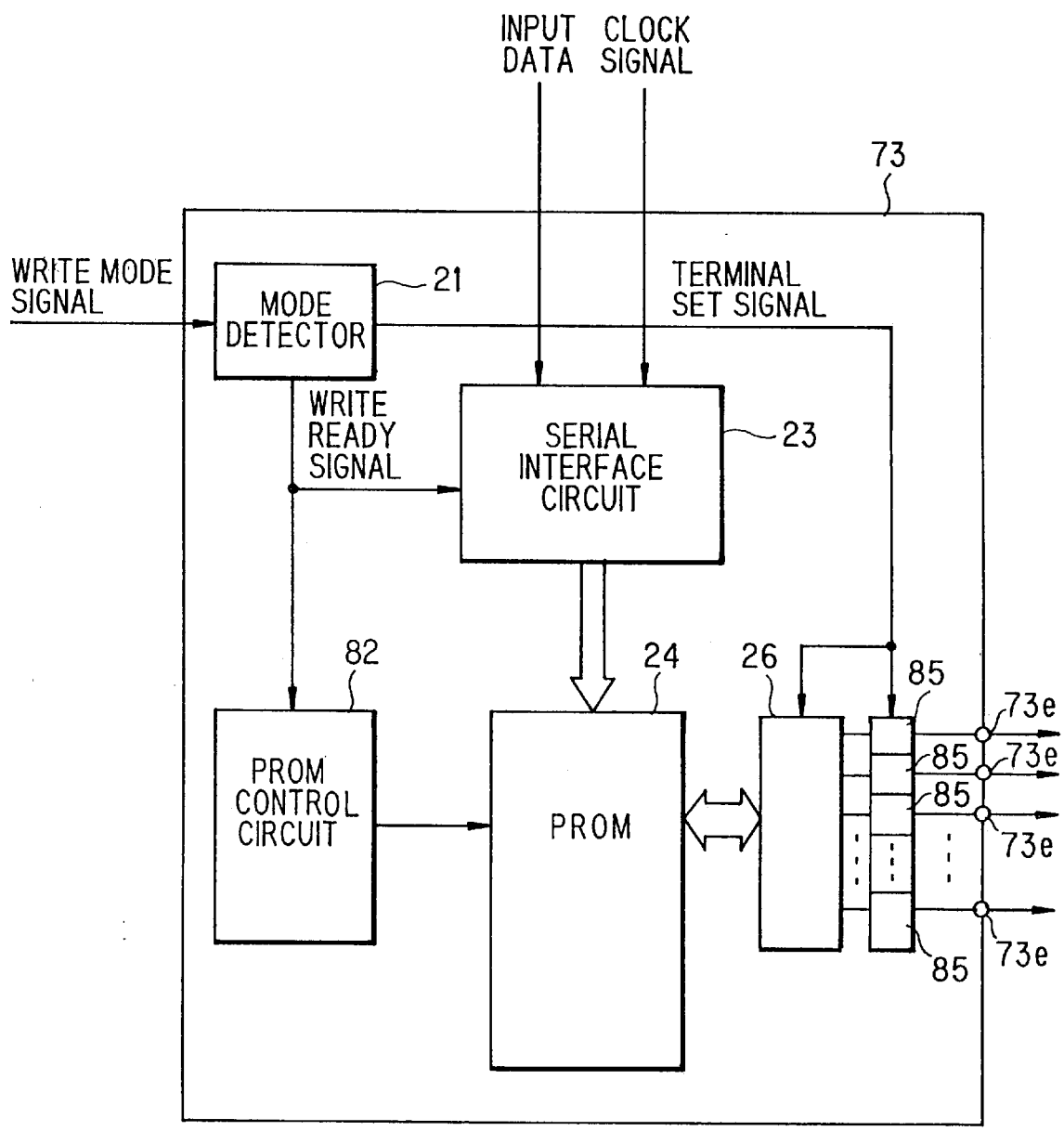
FIG. 7 is a block diagram illustrating a configuration of the IC 73 of FIG. 6.
Figure 8:
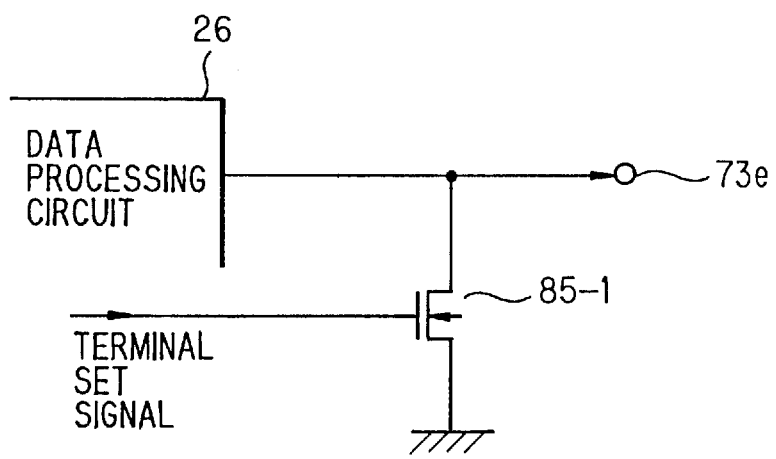
FIG. 8 is a circuit diagram illustrating an example of the terminal setting circuits 85 of FIG. 7.

FIG. 5 is a block diagram illustrating a configuration of the IC 43 of FIG. 4.

The IC 43 is provided with a parallel shift register 53 in place of the serial interface circuit 23 of the IC 13 of FIG. 2, by which the parallel port 44 is used exclusively, when the write mode signal is supplied, for receiving data to be written in the PROM 24.

Other parts in the set board of FIG. 4 and the IC 43 of FIG. 5 are the same with corresponding parts of the set board of FIG. 1 and the IC 13 of FIG. 2, respectively, and in the same way, each status of the I/O terminals 13e of the IC 43 is set appropriately according to circuit configuration of the peripheral circuit 16, causing no inconvenient operation of the peripheral circuit 16 even left active connected with the power supply 14 in the writing mode.

What is claimed is:

1. An apparatus for terminal setting of an integrated circuit having a PROM, said apparatus comprising:
   means for setting each of I/O terminals of the integrated circuit, not used for data-writing into the PROM, to a status predetermined respectively for each of said I/O terminals when data-writing into the PROM; and
   a memory for storing at least one predetermined status for each of said I/O terminals,
   wherein said means includes for each I/O terminal:
      a first transistor having a source connected to said I/O terminal, a drain connected to a power supply, and a gate connected to said memory for receiving from said memory a signal corresponding to said respective status predetermined for said I/O terminal, and
      a second transistor having a source connected to said I/O terminal, a drain connected to ground, and a gate connected to said memory for receiving from said memory said signal corresponding to said respective status predetermined for said I/O terminal.

2. The apparatus of claim 1, wherein said first transistor is an NMOS transistor and said second transistor is a pMOS transistor.

3. The apparatus of claim 2, wherein said signal either causes said I/O terminal to assume a ground potential or a potential of said power supply.

4. An apparatus for terminal setting of an integrated circuit having a PROM, said apparatus comprising:
   a mode detector for detecting a write mode signal supplied for controlling the integrated circuit in a writing mode for data-writing into the PROM;
   a terminal mode memory for storing data indicating predetermined statuses of I/O terminals of the integrated circuit not used in said writing mode;
   a terminal mode reader for reading out said data stored in said terminal mode memory and generating terminal mode signals in said write mode, logic of each of said terminal mode signals corresponding to a respective one of said predetermined statuses; and
   terminal setting circuits, said terminal setting circuits controlling statuses of said I/O terminals according to logic of corresponding ones of said terminal mode signals in said writing mode, said terminal setting circuits each including:
      a first transistor having a source connected to a respective one of said I/O terminals, a drain connected to a power supply, and a gate connected to said memory for receiving from said memory a signal corresponding to said respective status predetermined for said respective one of said I/O terminals, and
      a second transistor having a source connected to said respective one of said I/O terminals, a drain connected to ground, and a gate connected to said memory for receiving from said memory said signal corresponding to said respective status predetermined for said respective one of said I/O terminals.

5. A method of terminal setting of an integrated circuit having a PROM, said method comprising steps of:
   detecting a write mode signal supplied for controlling the integrated circuit in a writing mode for data-writing into the PROM;
   reading out data stored in a terminal mode memory, said data indicating predetermined statuses for a plurality of I/O terminals not used in said writing mode; and
   controlling statuses of said plurality of I/O terminals to correspond to respective ones of said predetermined statuses when said integrated circuit is in said writing mode, said controlling step including, for each of said plurality of I/O terminals, steps of:
      inputting a terminal mode signal into gates of first and second transistors, said terminal mode signal causing either said first transistor to switch on and said second transistor to switch off to thereby cause said I/O terminal to be set at a status corresponding to a power supply potential, or cause said first transistor to switch off and said second transistor to switch on to thereby cause said I/O terminal to be set at a status corresponding to a ground potential.

6. The method of claim 5, wherein said first transistor is an nMOS transistor and said second transistor is a pMOS transistor.

7. An apparatus for terminal setting of an integrated circuit having a PROM which is rewritable after the integrated circuit is assembled on a set board together with at least one peripheral circuit, said apparatus comprising:

means for setting each of said I/O terminals of the integrated circuit, connected to said at least one peripheral circuit and not used for data-writing into the PROM, to a status predetermined respectively for each of I/O terminals when data-writing into the PROM; and a memory for storing at least one predetermined status for each of said I/O terminals, wherein said means includes for each I/O terminal;

a first transistor having a source connected to said I/O terminal, a drain connected to a power supply, and a gate connected to said memory for receiving from said memory a signal corresponding to said respective status predetermined for said I/O terminal, and a second transistor having a source connected to said I/O terminal, a drain connected to ground, and a gate connected to said memory for receiving from said memory said signal corresponding to said respective status predetermined for said I/O terminal.

8. An apparatus for terminal setting of an integrated circuit having a PROM which is rewritable after the integrated circuit is assembled on a set board together with at least one peripheral circuit, said apparatus comprising:

a mode detector for detecting a write mode signal supplied for controlling the integrated circuit in a writing mode for data-writing into the PROM;

a terminal mode memory for storing data indicating predetermined statuses of I/O terminals of the integrated circuit not used in said writing mode;

a terminal mode reader for reading out said data stored in said terminal mode memory and generating terminal mode signals in said write mode, logic of each of said terminal mode signals corresponding to a respective one of said predetermined statuses; and terminal setting circuits, said terminal setting circuits controlling statuses of said I/O terminals according to logic of corresponding ones of said terminal mode signals in said writing mode, said terminal setting circuits each including:

a first transistor having a source connected to a respective one of said I/O terminals, a drain connected to a power supply, and a gate connected to said memory for receiving from said memory a signal corresponding to said respective status predetermined for said respective one of said I/O terminals, and a second transistor having a source connected to said respective one of said I/O terminals, a drain connected to ground, and a gate connected to said memory for receiving from said memory said signal corresponding to said respective status predetermined for said respective one of said I/O terminals.

9. A method of terminal setting of an integrated circuit having a PROM which is rewritable after the integrated circuit is assembled on a set board together with at least one peripheral circuit, said method comprising steps of:

detecting a write mode signal supplied for controlling the integrated circuit in a writing mode for data-writing into the PROM;

reading out data stored in a terminal mode memory, said data indicating predetermined statuses of I/O terminals of the integrated circuit not used in said writing mode;

controlling statuses of said I/O terminals to correspond to respective ones of said predetermined statuses when said integrated circuit is in said writing mode, said controlling step including, for each of said I/O terminals, steps of:

inputting a terminal mode signal into gates of first and second transistors, said terminal mode signal causing either said first transistor to switch on and said second transistor to switch off to thereby cause said I/O terminal to be set at a status corresponding to a power supply potential, or causing said first transistor to switch off and said second transistor to switch on to thereby cause said I/O terminal to be set at a status corresponding to a ground potential.

\* \* \* \* \*